United States Patent
Sano et al.

(10) Patent No.: US 7,288,208 B2
(45) Date of Patent: Oct. 30, 2007

(54) METHOD OF MANUFACTURING ZNO SUBSTRATE FROM ZNO CRYSTAL FORMED BY HYDROTHERMAL SYNTHESIS METHOD

(75) Inventors: Michihiro Sano, Tokyo (JP); Hiroyuki Kato, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 79 days.

(21) Appl. No.: 11/392,863

(22) Filed: Mar. 29, 2006

(65) Prior Publication Data

US 2006/0283834 A1 Dec. 21, 2006

(30) Foreign Application Priority Data

Jun. 21, 2005 (JP) ............... 2005-180990

(51) Int. Cl.
*B44C 1/22* (2006.01)
*C03C 15/00* (2006.01)
*C03C 25/68* (2006.01)
*C23F 1/00* (2006.01)

(52) U.S. Cl. .................... 216/101; 117/2

(58) Field of Classification Search ............... 216/101, 216/87, 96, 97; 117/2, 3
See application file for complete search history.

(56) References Cited

U.S. PATENT DOCUMENTS

| | | | |
|---|---|---|---|
| 5,384,674 A | 1/1995 | Nishida et al. ........... 360/72.2 |
| 5,555,098 A | 9/1996 | Parulski ................... 386/104 |
| 5,687,160 A | 11/1997 | Aotake et al. | |
| 5,712,947 A | 1/1998 | Oguro et al. | |
| 5,731,852 A | 3/1998 | Lee | |
| 5,745,643 A | 4/1998 | Mishina ................... 386/106 |
| 6,067,400 A | 5/2000 | Saeki et al. | |
| 6,148,138 A | 11/2000 | Sawabe et al. | |
| 6,185,365 B1 | 2/2001 | Murase et al. | |
| 6,253,026 B1 | 6/2001 | Saeki et al. | |
| 6,353,702 B1 | 3/2002 | Ando et al. | |
| 6,385,389 B1 | 5/2002 | Maruyama et al. | |
| 6,389,222 B1 | 5/2002 | Ando et al. | |
| 6,421,499 B1 | 7/2002 | Kim et al. ............... 386/95 |
| 6,526,226 B2 | 2/2003 | Kashiwagi et al. | |
| 6,560,406 B2 | 5/2003 | Ando et al. ............... 386/95 |
| 6,594,442 B1 | 7/2003 | Kageyama et al. ......... 386/96 |
| 6,721,493 B1 | 4/2004 | Moon et al. ............... 386/121 |
| 2002/0054049 A1 | 5/2002 | Toyoda et al. ............. 345/700 |

FOREIGN PATENT DOCUMENTS

| | | |
|---|---|---|
| EP | 1 065 665 A1 | 1/2001 |
| JP | 5-81787 | 4/1993 |
| JP | 5-158778 | 6/1993 |
| JP | 5-165935 | 7/1993 |
| JP | 7-143429 | 6/1995 |
| JP | 8-106721 | 4/1996 |
| JP | 8-205014 | 8/1996 |
| JP | 9-182013 | 7/1997 |
| JP | 9-259539 | 10/1997 |
| JP | 11-136613 | 5/1999 |
| JP | 11-215471 | 8/1999 |
| JP | 11-238362 | 8/1999 |
| JP | 2000-4421 | 1/2000 |
| JP | 2004-296821 A | 10/2004 |

*Primary Examiner*—Roberts Culbert
(74) *Attorney, Agent, or Firm*—Frishauf, Holtz, Goodman & Chick, P.C.

(57) ABSTRACT

Li impurities are removed from a substrate of ZnO formed by a hydrothermal synthesis method. The surface layer of the substrate with Li impurities removed, is etched to planarize the substrate.

8 Claims, 8 Drawing Sheets

METHOD OF MANUFACTURING ZNO SUBSTRATE FROM ZNO CRYSTAL FORMED BY HYDROTHERMAL SYNTHESIS METHOD

CROSS REFERENCE TO RELATED APPLICATION

This application is based on and claims priority of Japanese Patent Application No. 2005-180990 filed on Jun. 21, 2005, the entire contents of which are incorporated herein by reference.

BACKGROUND OF THE INVENTION

1. Field of the Invention

The present invention relates to a manufacture method for a ZnO substrate, and more particularly to a method of manufacturing a ZnO substrate from a ZnO crystal formed by a hydrothermal synthesis method.

2. Description of the Related Art

Description will be made on a ZnO substrate manufacture method disclosed in JP-A-2004-296821. First a ZnO single crystal substrate is formed by using a hydrothermal synthesis method. A buffer layer made of ZnO— contained compound is formed on the substrate. An element layer made of ZnO is formed on the buffer layer. Interface impurities may exist excessively on the principal surface and nearby surfaces of the substrate formed by the hydrothermal synthesis method. It is possible to effectively suppress growth of lattice defect and dislocation to be caused by interface impurities.

ZnO crystal formed by the hydrothermal synthesis method is sliced and polished in a wafer form, and thereafter subjected to heat treatment in a crucible of polycrystalline ZnO. This heat treatment removes strain in a surface layer formed during surface polishing and further planarizes the surface. If the principal surface of the substrate is a −c face (O-polar face), the substrate is planarized to such a degree that steps having height of one atom layer can be observed. In this specification, the "principal surface" means one of both surfaces of a substrate on which a functional element such as a light emitting device is formed.

The present inventors have found that if the principal surface of a substrate is a +c face (Zn-polar face), step bunching, that is, steps having a height corresponding to a plurality of molecular layers occurs and the surface has large irregularity. This may be ascribed to a higher dissociation pressure at the +c face than that at the −c face.

The present inventors have found also that the electrical characteristics of a ZnO film are shifted from desired characteristics, if the ZnO film is formed by metal organic chemical vapor deposition (MOCVD) or the like, on a ZnO substrate formed by the hydrothermal synthesis method. It has been found that it is difficult to form desired electrical characteristics, particularly when a ZnO film of n-type conductivity type is formed. This reason will be described below.

Figure 8:
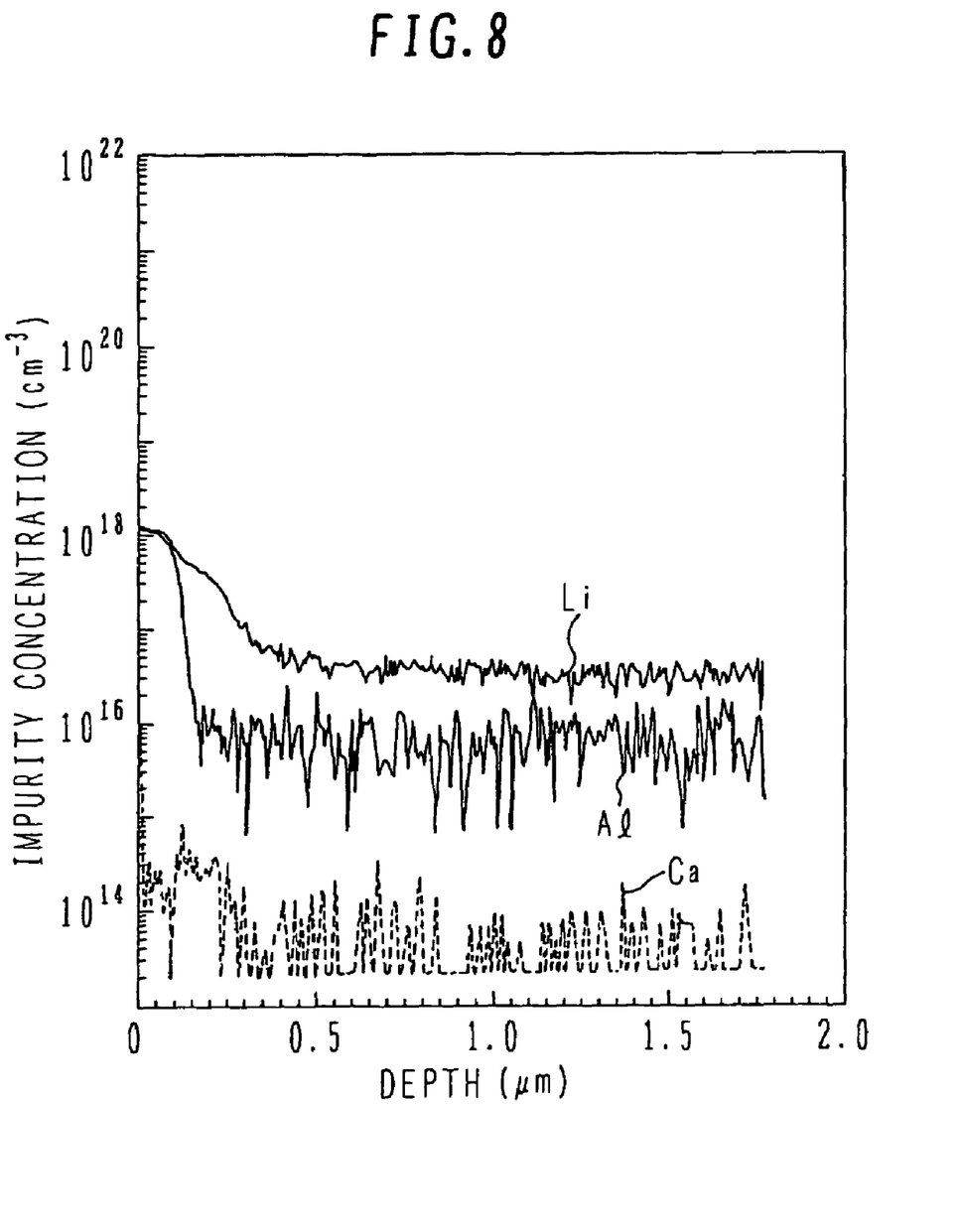
FIG. 8 is a graph showing an impurity concentration in a ZnO substrate formed by a conventional method.

FIG. 8 shows the measurement results of impurity concentrations contained in a ZnO substrate formed by the hydrothermal synthesis method and subjected to heat treatment, the impurity concentrations being measured by a secondary ion mass spectrometry method. The abscissa represents a substrate depth in the unit of "μm" and the ordinate represents an impurity concentration in the unit of "$cm^{-3}$". It can be seen that a relatively large number of Li atoms are contained in a surface layer shallower than a depth of 0.4 μm. Li atoms contained in the substrate result from use of lithium hydroxide (LiOH) as solvent during crystal growth by the hydrothermal synthesis method.

As a Li atom is captured in a ZnO crystal at a Zn lattice position, the Li atom functions as a p-type dopant, and as a Li atom is captured at an inter-lattice position, the Li atom functions as an n-type dopant. Conductivity of ZnO is therefore influenced. As a ZnO film is formed on the ZnO substrate, Li atoms in the substrate are diffused into the ZnO film. Since the electrical characteristics of the ZnO film are influenced by the diffused Li atoms, it becomes difficult to obtain desired electrical characteristics.

As shown in FIG. 8, it can be considered that Li atoms captured in the ZnO substrate diffuse toward the surface and a Li concentration in the surface layer increases. In order to control the electrical characteristics of the ZnO film formed on the substrate to have desired electrical characteristics, it is necessary to remove Li atoms contained in the substrate prior to forming the ZnO film.

SUMMARY OF THE INVENTION

An object of this invention is to provide a ZnO substrate manufacturing method capable of planarizing the surface of a ZnO substrate formed by a hydrothermal synthesis method and lowering a Li concentration.

According to one aspect of the present invention, there is provided a ZnO substrate manufacture method comprising steps of: (a) removing Li impurities from a substrate of ZnO formed by a hydrothermal synthesis method; and (b) etching a surface layer of the substrate with Li impurities removed, to planarize the substrate.

According to another aspect of the present invention, there is provided a ZnO substrate manufacture method comprising steps of: (a) performing heat treatment under a condition that a −c face of a substrate of ZnO formed by a hydrothermal synthesis method contacts a member of ZnO; and (b) forming a ZnO film on the −c face of the substrate.

Li contained in a ZnO substrate formed by the hydrothermal synthesis method is removed and thereafter a ZnO film is formed. The ZnO film having desired electrical characteristics can therefore be formed. As the ZnO substrate is subjected to heat treatment by contacting the ZnO substrate to a member made of ZnO, Li contained in the surface layer contacting the ZnO member can be removed effectively.

DESCRIPTION OF THE PREFERRED EMBODIMENTS

Figure 1:
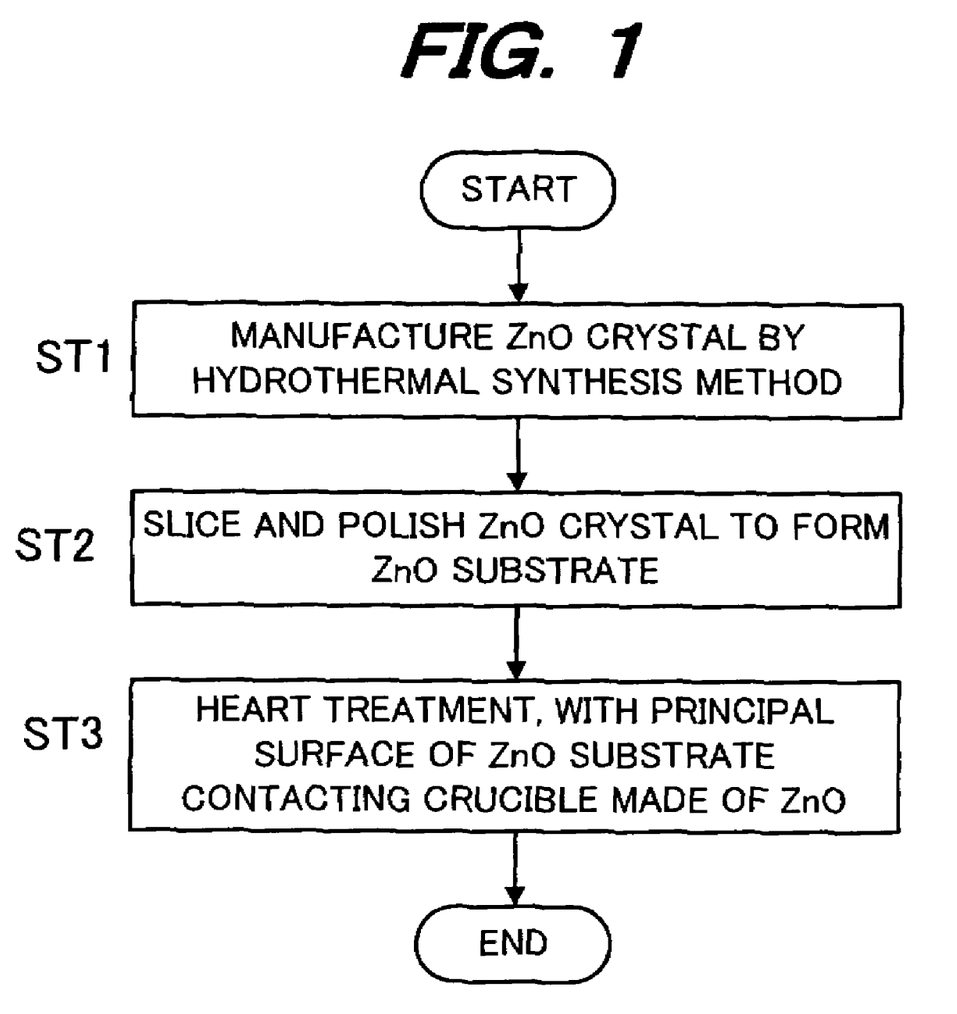
FIG. 1 is a flow chart illustrating a ZnO substrate manufacture method according to a first embodiment.

FIG. 1 is a flow chart illustrating a ZnO substrate manufacture method according to the first embodiment. In the first embodiment, a ZnO substrate is formed which has a −c face as its principal surface. First, at Step ST1, a ZnO crystal is formed by a hydrothermal synthesis method. Potassium hydroxide (KOH) and LiOH are used as solvent. At Step ST2, the ZnO crystal obtained is sliced and its surface is polished, to form a ZnO substrate. Next, at Step ST3, the substrate is subjected to heat treatment.

Figure 2:
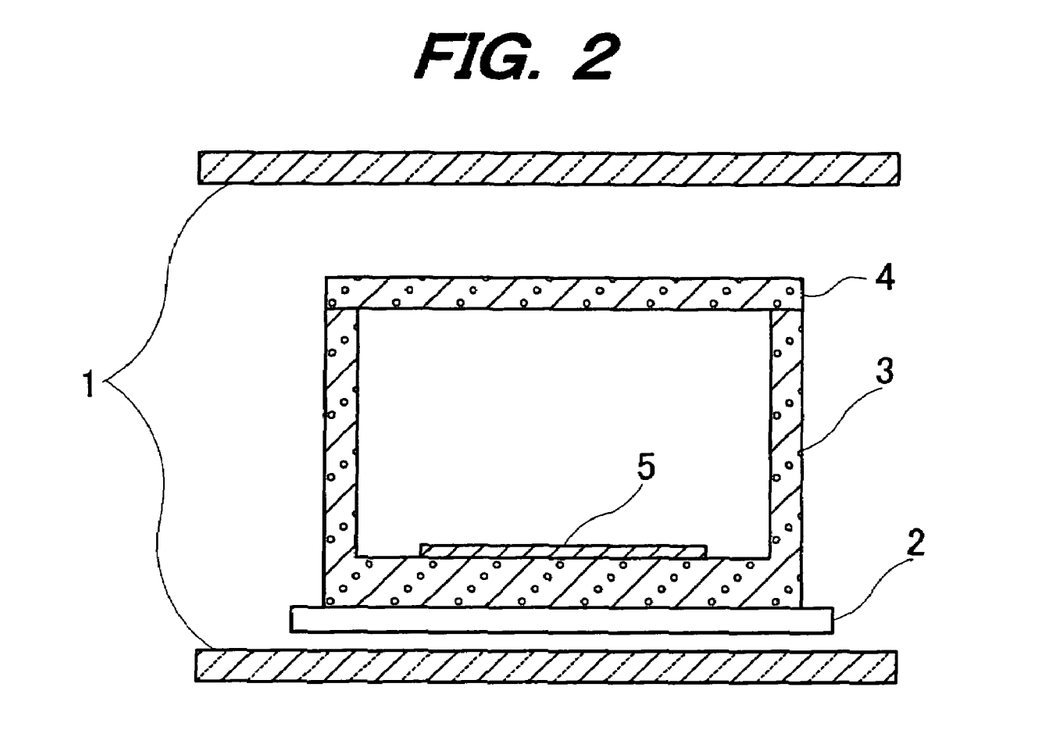
FIG. 2 is a schematic cross sectional view of a heat treatment apparatus to be used by the ZnO substrate manufacture method of the first embodiment.

FIG. 2 is a schematic diagram showing a heat treatment apparatus. A resistance heating heater 2 is disposed in a reactor tube 1 made of quartz. A crucible 3 made of polycrystalline ZnO is placed on the resistance heating heater 2. A lid 4 of the crucible 3 is also made of polycrystalline ZnO.

Next, description will be made on a heat treatment method using the heat treatment apparatus shown in FIG. 2. The ZnO substrate 5 manufactured at Step ST2 is loaded in the crucible 3, with the principal surface contacting the inner bottom surface of the crucible 3. The crucible 3 is closed with the lid 4, inserted into the reactor tube 1, and placed on the heater 2. While oxygen gas is flowed in the reactor tube 1, the ZnO substrate 5 is heated with the heater 2. For example, a heating temperature is set to 1000° C., an oxygen gas pressure is set to one atmospheric pressure, and a heat treatment time is set to one hour. An atmosphere may be the atmospheric air.

After the heat treatment, the temperatures of the crucible 3 and ZnO substrate 5 are lowered to about a room temperature, the crucible 3 is brought out of the reactor tube 1, and the ZnO substrate 5 is gotten out of the crucible 3.

Figure 3:
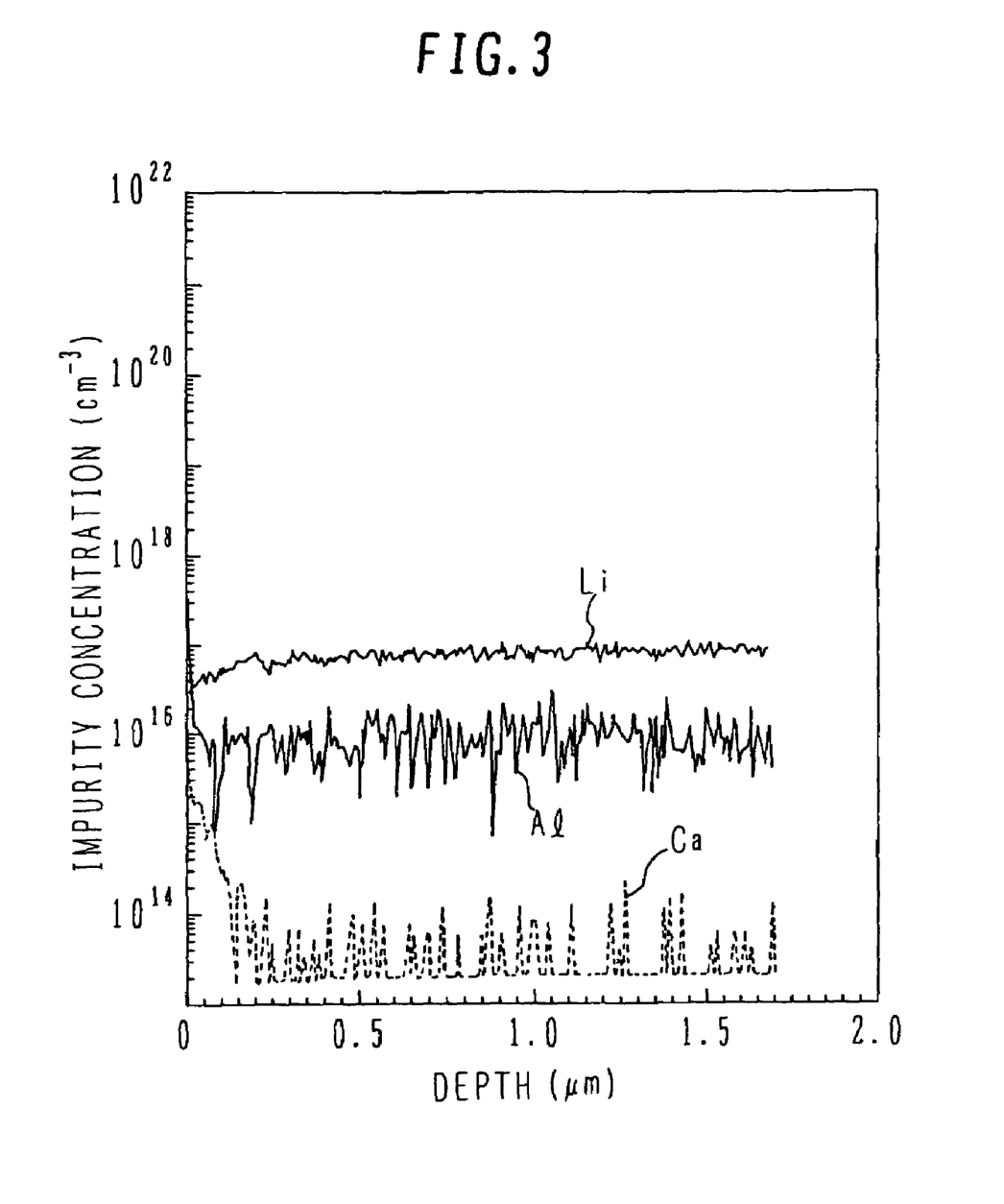
FIG. 3 is a graph showing an impurity concentration of a ZnO substrate manufactured by the method of the first embodiment.

FIG. 3 shows measurement results of an impurity concentration distribution in a ZnO substrate manufactured by the method of the first embodiment, the impurity concentration distribution being measured by a secondary ion mass spectrometry method. The abscissa represents a depth in the unit of "μm" and the ordinate represents an impurity concentration in the unit of "$cm^{-3}$". It can be seen that a Li concentration is $1 \times 10^{17}$ $cm^{-3}$ or smaller over the whole range in a depth direction. A phenomenon of a high Li concentration in a surface layer shown in FIG. 8 does not occur. This may be ascribed to that Li atoms diffused from the inside of the ZnO substrate toward the surface do not remain in the surface layer but are absorbed in the crucible 3 made of ZnO. The crucible 3 made of ZnO may be replaced with another member made of ZnO not containing Li as impurities.

Figure 4:
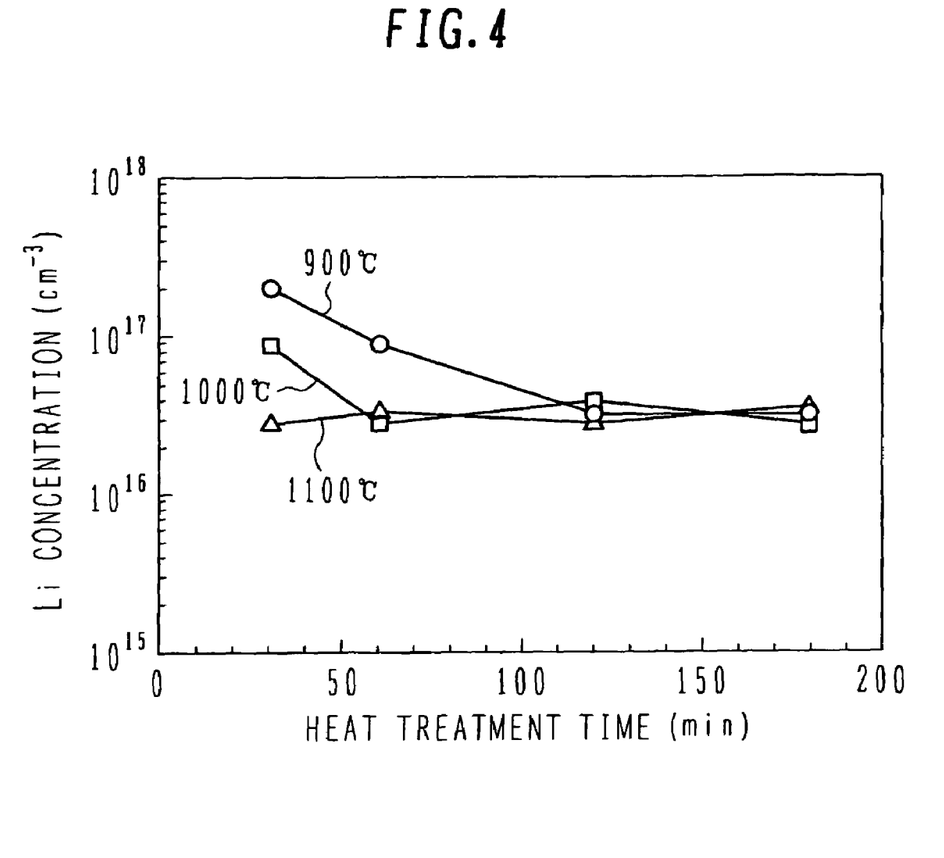
FIG. 4 is a graph showing a relation between a Li concentration and a heat treatment time of the heat treatment process of the manufacture method of the first embodiment, with respect to each heat treatment temperature.

FIG. 4 shows a relation between a heat treatment time and a Li concentration with respect to each heat treatment temperature. The abscissa represents a heat treatment time in the unit of "min" and the ordinate represents a Li concentration in the unit of "$cm^{-3}$". The Li concentration is an average value in the depth direction of the results obtained by a secondary ion mass spectrometry method. Circle, square and triangle symbols in FIG. 4 indicate Li concentrations at heat treatment temperatures of 900° C., 1000° C. and 1100° C., respectively.

At any heat treatment temperature, as the heat treatment time is made sufficiently long, a Li concentration can be lowered to about $3 \times 10^{16}$ $cm^{-3}$. At the heat treatment temperature of 1100° C., Li concentration becomes in almost a constant state at least in 30 minutes, at the heat treatment temperature of 1000° C., Li concentration becomes in almost a constant state in about 50 minutes, and at the heat treatment temperature of 900° C., Li concentration becomes in almost a constant state in about 100 minutes. As will be later described, if a light emitting device is to be formed on a ZnO substrate, a Li concentration in the ZnO substrate is preferably $4 \times 10^{16}$ $cm^{-3}$ or lower. In order to meet this requirement, it is preferable that a heat treatment time is 100 minutes or longer at the heat treatment temperature of 900° C. or higher, a heat treatment time is 50 minutes or longer at the heat treatment temperature of 1000° C. or higher, or a heat treatment time is 30 minutes or longer at the heat treatment temperature of 1100° C. or higher.

In order to evaluate the electrical characteristics of a ZnO film on a ZnO substrate, a ZnO film was formed by molecular beam epitaxy (MBE) on the principal surfaces of a ZnO substrate manufactured by the first embodiment method and a ZnO substrate manufactured by a conventional method. The ZnO film was formed at a substrate temperature of 700° C.

Figure 5:
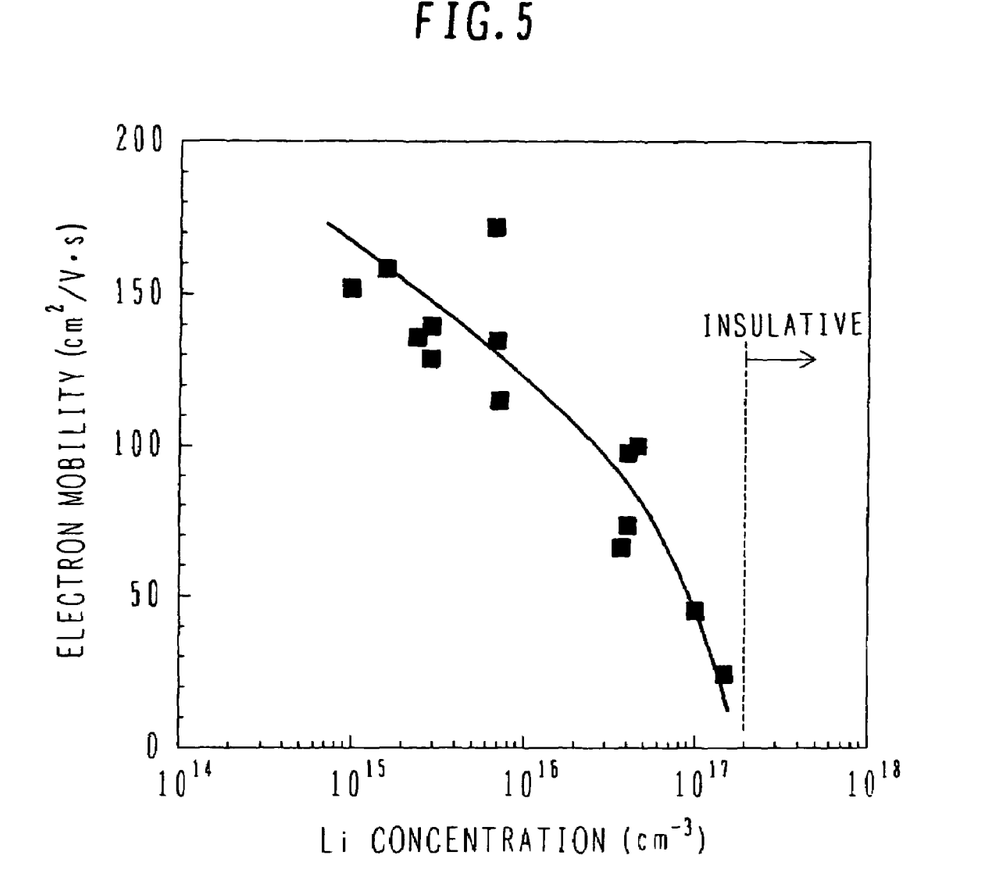
FIG. 5 is a graph showing a relation between a Li concentration and an electron mobility of a ZnO film formed on a ZnO substrate.

FIG. 5 shows a relation between a Li concentration and an electron mobility in a ZnO film. The Li concentration was measured by a secondary ion mass spectrometry method, and the electron mobility was obtained from a Hall constant measured by a van der Pauw's method. It can be seen that as the Li concentration increases, the electron mobility lowers. As the Li concentration becomes $2 \times 10^{17}$ $cm^{-3}$ or higher, the ZnO film becomes almost insulative.

If the ZnO film is used as a light emitting device, the Li concentration is preferably set to $1 \times 10^{16}$ $cm^{-3}$ or lower. In order to meet this requirement, the Li concentration in a ZnO substrate is preferably set to $4 \times 10^{16}$ $cm^{-3}$ or lower at a ZnO film growth temperature of 700° C.

In the first embodiment, the −c face is used as the principal surface of a ZnO substrate. If the first embodiment method is adopted for the +c face as the principal surface of a ZnO substrate, step bunching occurs on the principal surface during heat treatment or steps higher than one molecular layer is formed on the surface. The second embodiment to be described below is intended to obtain a flat principal surface.

Figure 6:
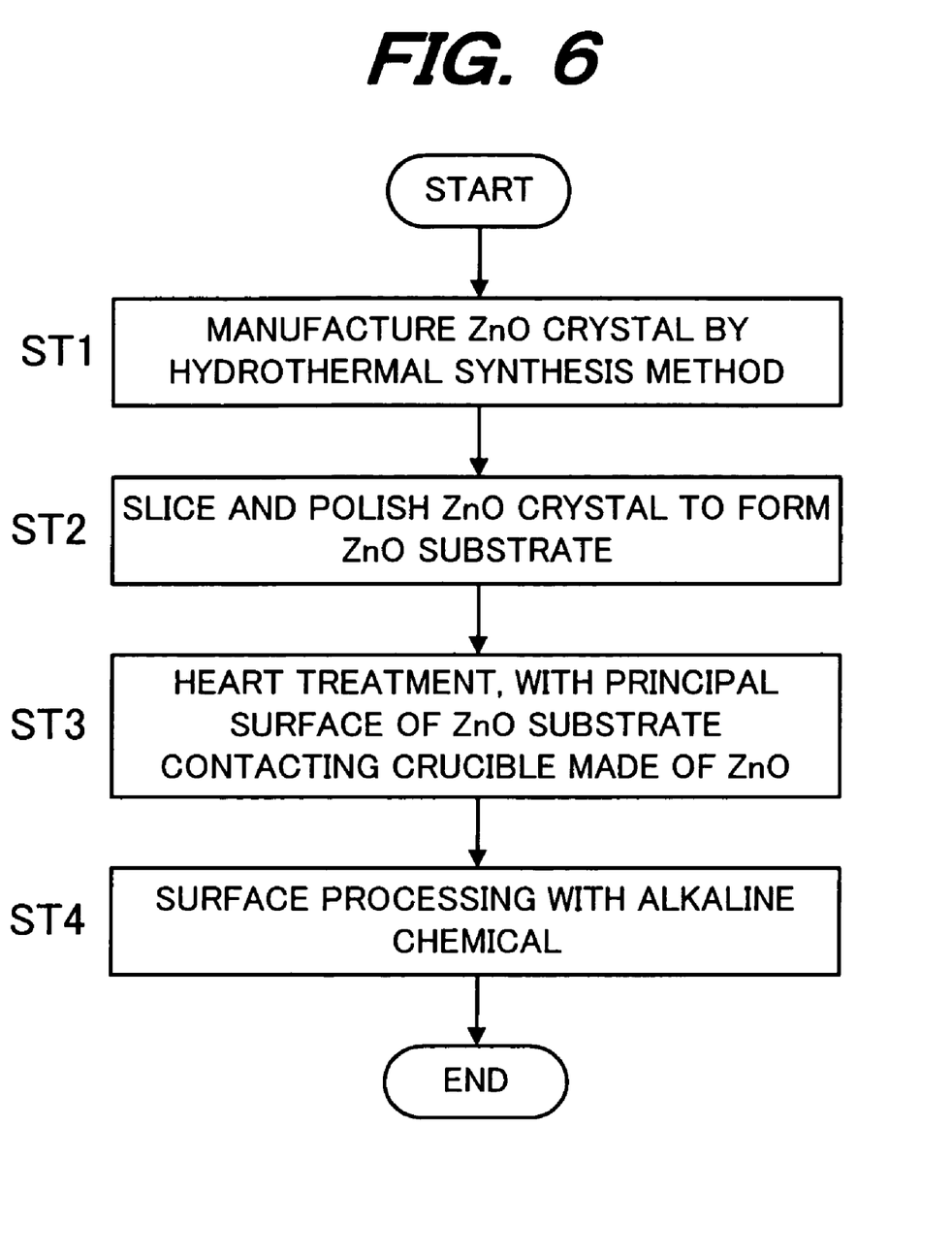
FIG. 6 is a flow chart illustrating a ZnO substrate manufacture method according to a second embodiment.

FIG. 6 is a flow chart illustrating a ZnO substrate manufacture method according to the second embodiment. Step ST1 to Step ST3 are the same as those of the first embodiment. However, the principal surface of a ZnO substrate used in the second embodiment is the +c face. In the second embodiment, after the heat treatment at Step ST3, surface processing is performed by alkaline chemical at Step ST4.

Mixture liquids of ethylenediaminetetraacetic acid disodium dihydrogen (EDTA solution) and ethylenediamine were used as alkaline chemicals. PH can be adjusted by mixing ethylenediamine alkaline solution with EDTA acid solution. Surface processing of ZnO substrates was conducted by using first and second chemicals. The first and second chemicals were prepared by mixing EDTA having a concentration of 0.2 mol/L and ethylenediamine having a concentration of 99% at volume ratios of 20:1 and 10:1, respectively.

Figure 7:
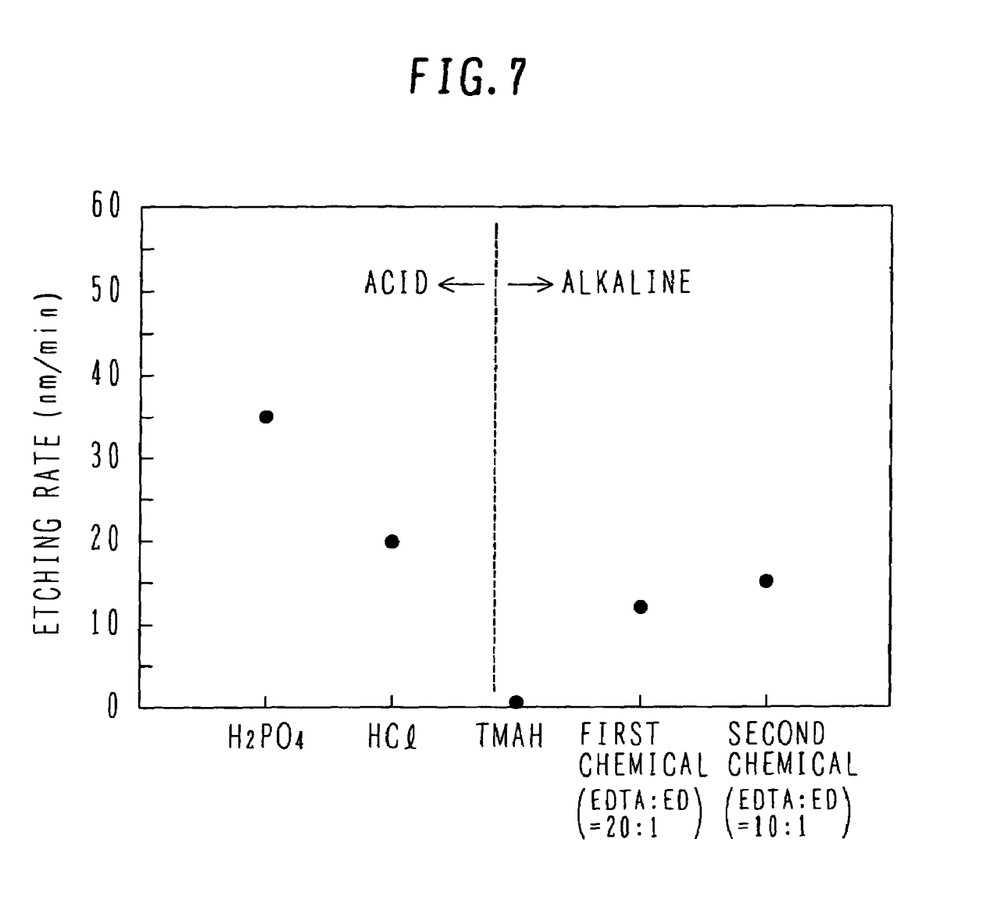
FIG. 7 is a graph showing an etching rate of ZnO with respect to each chemical used for surface planarization.

For the purposes of comparison, surface processing was conducted by using tetramethylammonium hydroxide (TMAH) having a concentration of 25%, hydrochloric acid having a concentration of 4% and phosphoric acid having a concentration of 8%.

FIG. 7 shows an etching rate of ZnO for each chemical. The abscissa represents each chemical and the ordinate represents an etching rate in the unit of "nm/min". As etching was performed for 30 minutes by using hydrochloric acid and phosphoric acid, a number of etch pits of regular hexagon were generated on the surface of ZnO substrates. This is because ZnO exhibits anisotropical etching property in etching by acid. As compared to alkaline chemical, although use of acid chemical increases an etching rate, etch pits are generated so that the surface of a ZnO substrate cannot be made flat. The ZnO substrate was hardly etched by TMAH.

A flat surface without etch pits was able to be obtained through etching for one hour at a room temperature using the first chemical. As a strong alkaline second chemical with an increased concentration of ethylenediamine is used, although an etching rate is increased, the surface flatness is degraded. In order to maintain high surface flatness, it is preferable to adjust a mixture ratio between EDTA and ethylenediamine to be in a pH range of 7 to 11.

In the second embodiment, although the surface is made flat by using chemical mixing EDTA and ethylenediamine, other chemicals having a pH of 7 to 11 may also be used.

The present invention has been described in connection with the preferred embodiments. The invention is not limited only to the above embodiments. It will be apparent to those skilled in the art that other various modifications, improvements, combinations, and the like can be made.

What we claim are:

1. A ZnO substrate manufacture method comprising steps of:
   (a) removing Li impurities from a substrate of ZnO formed by a hydrothermal synthesis method; and
   (b) etching a surface layer of the substrate with Li impurities removed, to planarize the substrate.

2. The ZnO substrate manufacture method according to claim 1, wherein in the step (b), the surface layer of the substrate is etched by using etchant not having a pH lower than 7 and higher than 11.

3. The ZnO substrate manufacture method according to claim 1, wherein the etchant used in the step (b) includes mixture liquid of ethylenediaminetetraacetic acid disodium dihydrogen and ethylenediamine.

4. The ZnO substrate manufacture method according to claim 1, wherein:
   the step (a) includes a step of performing heat treatment under a condition that a principal surface of the substrate contacts a member made of ZnO; and
   the step (b) planarizes the principal surface.

5. The ZnO substrate manufacture method according to claim 4, wherein the step (a) performs the heat treatment under a condition of a heat treatment temperature of 900° C. or higher and a heat treatment time of 100 minutes or longer, under a condition of a heat treatment temperature of 1000° C. or higher
   and a heat treatment time of 50 minutes or longer, or under a condition of a heat treatment temperature of 1100° C. or higher and a heat treatment time of 30 minutes or longer.

6. The ZnO substrate manufacture method according to claim 4, wherein the principal surface of the substrate is a+c face of ZnO.

7. A ZnO substrate manufacture method comprising steps of:
   (a) performing heat treatment under a condition that a−c face of a substrate of ZnO formed by a hydrothermal synthesis method contacts a member of ZnO; and
   (b) forming a ZnO film on the −c face of the substrate.

8. The ZnO substrate manufacture method according to claim 7, wherein the step (a) performs the heat treatment under a condition of a heat treatment temperature of 900° C. or higher and a heat treatment time of 100 minutes or longer, under a condition of a heat treatment temperature of 1000° C. or higher and a heat treatment time of 50 minutes or longer, or under a condition of a heat treatment temperature of 1100° C. or higher and a heat treatment time of 30 minutes or longer.

* * * * *

UNITED STATES PATENT AND TRADEMARK OFFICE
CERTIFICATE OF CORRECTION

| | |
|---|---|
| PATENT NO. | : 7,288,208 B2 |
| APPLICATION NO. | : 11/392863 |
| DATED | : October 30, 2007 |
| INVENTOR(S) | : Sano et al. |

It is certified that error appears in the above-identified patent and that said Letters Patent is hereby corrected as shown below:

Title page, Item (56) References Cited, under "U.S. PATENT DOCUMENTS", delete the following:

| | | |
|---|---|---|
| "5,384,674 A | 1/1995 | Nishida et al. ............ 360/72.2 |
| 5,555,098 A | 9/1996 | Parulski ..................... 386/104 |
| 5,687,160 A | 11/1997 | Aotake et al. |
| 5,712,947 A | 1/1998 | Oguro et al. |
| 5,731,852 A | 3/1998 | Lee |
| 5,745,643 A | 4/1998 | Mishina ..................... 386/106 |
| 6,067,400 A | 5/2000 | Saeki et al. |
| 6,148,138 A | 11/2000 | Sawabe et al. |
| 6,185,365 B1 | 2/2001 | Murase et al. |
| 6,253,026 B1 | 6/2001 | Saeki et al. |
| 6,353,702 B1 | 3/2002 | Ando et al. |
| 6,385,389 B1 | 5/2002 | Maruyama et al. |
| 6,389,222 B1 | 5/2002 | Ando et al. |
| 6,421,499 B1 | 7/2002 | Kim et al. .................... 386/95 |
| 6,526,226 B2 | 2/2003 | Kashiwagi et al. |
| 6,560,406 B2 | 5/2003 | Ando et al. .................... 386/95 |
| 6,594,442 B1 | 7/2003 | Kageyama et al. ........... 386/96 |
| 6,721,493 B1 | 4/2004 | Moon et al. ................ 386/121 |
| 2002/0054049 A1 | 5/2002 | Toyoda et al. .............. 345/700" |

Title page, Item (56) References Cited, under "FOREIGN PATENT DOCUMENTS", delete the following:

| | | |
|---|---|---|
| "EP | 1 065 665 A1 | 1/2001 |
| JP | 5-81787 | 4/1993 |
| JP | 5-158778 | 6/1993 |
| JP | 5-165935 | 7/1993 |

UNITED STATES PATENT AND TRADEMARK OFFICE
CERTIFICATE OF CORRECTION

PATENT NO. : 7,288,208 B2
APPLICATION NO. : 11/392863
DATED : October 30, 2007
INVENTOR(S) : Sano et al.

It is certified that error appears in the above-identified patent and that said Letters Patent is hereby corrected as shown below:

| | | |
|---|---|---|
| JP | 7-143429 | 6/1995 |
| JP | 8-106721 | 4/1996 |
| JP | 8-205014 | 8/1996 |
| JP | 9-182013 | 7/1997 |
| JP | 9-259539 | 10/1997 |
| JP | 11-136613 | 5/1999 |
| JP | 11-215471 | 8/1999 |
| JP | 11-238362 | 8/1999 |
| JP | 2000-4421 | 1/2000" |

Signed and Sealed this

Third Day of November, 2009

David J. Kappos
*Director of the United States Patent and Trademark Office*